(12) United States Patent
Morita et al.

(10) Patent No.: US 8,541,326 B2
(45) Date of Patent: Sep. 24, 2013

(54) OPTICAL MEMBER FOR DEEP ULTRAVIOLET AND PROCESS FOR PRODUCING SAME

(75) Inventors: Ryusuke Morita, Tokyo (JP); Takuya Nakagawa, Tokyo (JP); Kei Iwata, Tokyo (JP); Masaaki Takata, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/459,624

(22) Filed: Apr. 30, 2012

(65) Prior Publication Data

US 2012/0213685 A1    Aug. 23, 2012

Related U.S. Application Data

(63) Continuation of application No. PCT/JP2010/069007, filed on Oct. 26, 2010.

(30) Foreign Application Priority Data

Oct. 30, 2009    (JP) .................................. 2009-250195

(51) Int. Cl.
*C03C 3/06* (2006.01)
*C03B 19/06* (2006.01)
*C03B 19/00* (2006.01)

(52) U.S. Cl.
USPC .............................. 501/54; 65/17.4; 65/17.6

(58) Field of Classification Search
USPC .............................. 501/54, 55; 65/17.4, 17.6
See application file for complete search history.

(56) References Cited

U.S. PATENT DOCUMENTS

| 7,975,507 | B2 | 7/2011 | Hino | |
|---|---|---|---|---|
| 2007/0004579 | A1* | 1/2007 | Bookbinder et al. | 501/54 |
| 2007/0277555 | A1* | 12/2007 | Hino | 65/17.4 |
| 2008/0066497 | A1* | 3/2008 | Weber et al. | 65/17.6 |

FOREIGN PATENT DOCUMENTS

| JP | 04-097922 | 3/1992 |
|---|---|---|
| JP | 2001-146434 | 5/2001 |
| JP | 2003-112933 | 4/2003 |
| JP | 2004-143011 | 5/2004 |
| JP | 2006-213570 | 8/2006 |
| JP | 2007-031217 | 2/2007 |

OTHER PUBLICATIONS

International Search Report issued Jan. 25, 2011 in PCT/JP2010/069007 filed Oct. 26, 2010.

* cited by examiner

*Primary Examiner* — Kaj Olsen
*Assistant Examiner* — Noah Wiese
(74) *Attorney, Agent, or Firm* — Oblon, Spivak, McClelland, Maier & Neustadt, L.L.P.

(57) ABSTRACT

The present invention relates to an optical member for deep ultraviolet having a wavelength of 250 nm or shorter, containing a synthetic silica glass which does not substantially contain a halogen element, has a maximum OH group content of less than 10 ppm by weight, has contents of ODC (oxygen deficient centers) and E-prime center of each less than $1 \times 10^{14}$ $cm^{-3}$, does not substantially contain SiH and peroxy linkage, and has a fictive temperature of 1,050° C. or lower.

20 Claims, No Drawings

OPTICAL MEMBER FOR DEEP ULTRAVIOLET AND PROCESS FOR PRODUCING SAME

TECHNICAL FIELD

The present invention relates to an optical member for deep ultraviolet suitable as an optical member of an exposure device utilizing deep ultraviolet having a wavelength of 250 nm or shorter, such as KrF excimer laser (wavelength: 248 nm) and ArF excimer laser (wavelength: 193 nm), as an exposing source, and a process for producing the same.

In the present description, the term "deep ultraviolet" hereinafter means ultraviolet having a wavelength of 250 nm or shorter.

BACKGROUND ART

Conventionally, an exposure device for producing an integrated circuit by transferring fine circuit patterns on a wafer is widely utilized in photolithography technology. With the trend toward a higher integration and higher functionality of an integrated circuit, downsizing of the integrated circuit is advanced. An exposure device is hence required to form an image of a circuit pattern on a wafer surface with high-resolution at a long focus depth, and shortening of the wavelength of an exposing source is being advanced. Deep ultraviolet such as KrF excimer laser (wavelength: 248 nm) and ArF excimer laser (wavelength: 193 nm) is going to be employed as the exposing source in place of the conventional g-ray (wavelength: 436 nm), i-ray (wavelength: 365 nm), and the like.

Synthetic silica glass has mainly been employed in an optical member of an exposure device including an exposure device employing deep ultraviolet as an exposing source for the reasons that, for example, the synthetic silica glass is transparent over the wavelength region in a wide range of from near infrared region to deep ultraviolet region, has extremely small thermal expansion coefficient and therefore has excellent dimensional stability, and does not almost contain metal impurities and therefore has high purity.

A glass having high OH group content, or synthetic silica glass having high purity having been subjected to hydrogen impregnation treatment has been used as an optical member for deep ultraviolet (for example, see Patent Document 1). This is a technique that, by increasing Si—OH contained in a glass, when a bond of $SiO_2$ is damaged by deep ultraviolet, a repairing action on the damage by Si—OH is increased, thereby attempting to maintain durability (transmission characteristics).

Conventionally, an optical member for deep ultraviolet in which Si—OH is increased to thereby increase repairing action has been produced and used. However, it came to be known that synthetic silica glass having high OH group content is not preferred in the view points of density change induced by deep ultraviolet irradiation and durability to birefringence change induced by polarized deep ultraviolet irradiation. The reason for this is that in the case that synthetic silica glass has been irradiated with deep ultraviolet, structure change occurs in the synthetic silica glass due to the presence of OH groups.

The phenomenon that densification of synthetic silica glass occurs with deep ultraviolet irradiation is also called "compaction". The compaction associated with deep ultraviolet irradiation causes unfavorable change on optical characteristics in the synthetic silica glass, such as increase in refractive index and occurrence of birefringence. Therefore, the compaction must be reduced as possible.

Some methods have conventionally been proposed as a method of decreasing OH group content. For example, a method of doping a synthetic silica glass with fluorine is proposed. Fluorine has an action to replace with OH group, and therefore easily decreases the OH group content. The fluorine further has an effect of decreasing viscosity coefficient of a glass. Therefore, distorted bond of Si—O—Si bond network is easily relaxed by heat treatment. In view of the above reasons, it has been considered that the method of doping a synthetic silica glass with fluorine is effective as a means of increasing durability to deep ultraviolet.

On the other hand, fluorine in an amount of several hundred ppm or more is required to be doped in order to impart sufficient deep ultraviolet durability to a synthetic silica glass by this method. However, the fluorine has an action of greatly decreasing refractive index of a glass, and in the case that distribution of fluorine doped is not uniform, striae and refractive index distribution occur. Therefore, unless this problem is solved, it is difficult to apply the synthetic silica glass doped with fluorine to an optical member for an exposure device which requires suppression of striae and high refractive index homogeneity. Furthermore, in the case that the synthetic silica glass doped with fluorine is used as an optical member for deep ultraviolet, there are some cases that a part of fluorine is liberated from the glass with the progress of irradiation with deep ultraviolet and is released as high-reactive $F_2$, and thereby, a device having the synthetic quart glass provided therein may be adversely affected. Thus, the synthetic silica glass doped with fluorine has various problems to be solved, for use as an optical member for deep ultraviolet.

In view of the above, it is considered that a synthetic silica glass in which content of OH group is small, defect of absorbing deep ultraviolet and precursor structure of the defect are not present, and the defect and its precursor structure do not formed even though heat treatment and irradiation of deep ultraviolet are continued, is preferred as an optical member for deep ultraviolet.

Patent Document 2 discloses an optical member for ultraviolet containing a synthetic silica glass obtained from a high purity silicon compound by heating a porous synthetic silica glass body obtained by depositing soot produced by a soot process of flame pyrolyzing the silicon compound, in which impurities other than OH group are not substantially contained, difference between the maximum value of a fictive temperature in the glass and the minimum value thereof is 50° C. or less, and transmission of ultraviolet having a wavelength of 157 nm is 60% or more in a optical path length of 10 mm. The optical member is an optically stable member having good transmission of deep ultraviolet and free of compaction associated with deep ultraviolet and change of light transmittance, and is considered that light absorption due to heat treatment at high temperature and irradiation with deep ultraviolet does not occur, and homogeneity is not deteriorated. In the optical member for ultraviolet, it is considered that OH group content is from 1 to 70 ppm by mass, Cl concentration is less than 1 ppm by mass, metal impurity concentration of each element is less than 10 ppb by mass, and the total amount of metal impurity concentrations is 50 ppb by mass or less.

RELATED ART DOCUMENTS

Patent Documents

Patent Document 1: JP-A 4-97922
Patent Document 2: JP-A 2001-146434

DISCLOSURE OF THE INVENTION

Problems to be Solved by the Invention

However, the present inventors have found that the synthetic silica glass described in Patent Document 2 has unfavorable side as an optical member for deep ultraviolet.

Patent Document 2 prepares the synthetic silica glass by methods containing the following steps (1) to (3).
(1) Step of forming a porous synthetic silica glass body by flame hydrolyzing glass forming raw materials and depositing the formed silica fine particles on a starting member, followed by vitrification;
(2) Step of holding the porous synthetic silica glass body in a temperature region of a transparent vitrification temperature or lower in an appropriate gas atmosphere for a certain period of time;
(3) Step of obtaining a synthetic silica glass material by transparent vitrifying the heat-treated porous synthetic silica glass body.

Patent Document 2 describes that distribution of a fictive temperature and OH content in the synthetic silica glass can be controlled by appropriately controlling heat treatment temperature, heat treatment time and atmosphere in the step (2). Examples of the means for the object include a method of carrying out heat treatment in nitrogen gas atmosphere for a sufficiently long period of time, and a method of carrying out heat treatment in a mixed gas of CO and $N_2$ or a mixed gas of $H_2$ and $N_2$ having an appropriate concentration for a relatively short period of time. It is also described that CO gas-containing atmosphere is preferred from the view point of effect.

However, in the case that the step (2) is carried out in CO gas-containing atmosphere, CO gas has strong reduction ability, and therefore abstracts oxygen atom of OH group in the porous synthetic silica glass body, thereby forming SiH, as shown in the formula (1) below.

$$Si\text{—}OH + CO \rightarrow SiH + CO_2 \qquad (1)$$

By this reaction, SiH is formed in the synthetic silica glass to be prepared. Patent Document 2 describes that the synthetic silica glass does not substantially contain impurities other than OH group. However, it is considered that the synthetic silica glass described in Patent Document 2 prepared by the method containing the above steps (1) to (3) contains a large amount of SiH as impurities.

When SiH is present in a synthetic silica glass, decrease in transmission when irradiating with deep ultraviolet becomes problem. The decrease in transmission depends on irradiation fluence of deep ultraviolet, and particularly becomes problem in the case that irradiation fluence is large.

Furthermore, when SiH is present in a synthetic silica glass, E-prime center (Si.) is relatively easily formed from SiH when irradiating with deep ultraviolet. The E-prime center formed has absorption center at a wavelength of 215 nm, and decreases transmission of deep ultraviolet, and thus, is not preferred. Furthermore, there are some cases that the E-primer center formed bonds to the adjacent bonding, thereby changing a network structure of the synthetic silica glass, and may adversely affect optical characteristics of the synthetic silica glass by, for example, increase in compaction. It is not preferred.

Patent Document 2 describes that OH group content of the synthetic silica glass is from 1 to 70 ppm by mass. However, the OH group content of the synthetic silica glass disclosed as Examples is 10 ppm by mass as the lowest content. According to the description of Examples, in the synthetic silica glass having the OH group content of 10 ppm by mass, atmosphere in the vitrification is He. Therefore, $O_2$ molecule in the porous synthetic silica glass is difficult to be abstracted, and peroxy linkage (Si—O—O—Si) may possibly be formed. The peroxy linkage causes non-bridging oxygen radical (NBOHC) by the mechanism shown in the formula (2) below when irradiating with deep ultraviolet.

$$Si\text{—}O\text{—}O\text{—}Si \rightarrow Si\text{—}O. + .O\text{—}Si \qquad (2)$$

Formation of NBOHC changes the network structure of the synthetic silica glass by bonding to the adjacent bonding, and may induce compaction. Furthermore, the formation of NBOHC also deteriorates deep ultraviolet transmission, thereby adversely affecting optical characteristics of the synthetic silica glass, and is therefore not preferred.

In order to solve the above problems, the present invention has objects to provide an optical member for deep ultraviolet, having excellent transmission characteristics of deep ultraviolet, and in which compaction associated with deep ultraviolet irradiation is reduced, and a process for producing the same.

Means for Solving the Problems

In order to achieve the above objects, the present invention provides an optical member for deep ultraviolet having a wavelength of 250 nm or shorter, containing a synthetic silica glass which does not substantially contain a halogen element, has a maximum OH group content of less than 10 ppm by mass, has contents of ODC (oxygen deficient centers) and E-prime center (Si.) of each less than $1\times10^{14}$ cm$^{-3}$, does not substantially contain SiH and peroxy linkage, and has a fictive temperature of 1,050° C. or lower.

In the optical member for deep ultraviolet according to the present invention, it is preferred that variation in the fictive temperature in the synthetic silica glass is 5° C. or less.

Further, the present invention provides a process for producing the optical member for deep ultraviolet according to the present invention described above in which synthetic silica glass fine particles are deposited and grown by flame hydrolysis reaction using a silicon compound as a raw material to thereby synthesize a porous synthetic silica glass body, and thereafter transparent vitrification is carried out to obtain a synthetic silica glass, in which the process contains steps of synthesizing the porous synthetic silica glass body having a volume average bulk density of 0.33 g·cm$^{-3}$ or more, subsequently subjecting the porous synthetic silica glass body to a heat treatment in a temperature range of from 1,050 to 1,250° C. for a period of time exceeding 90 hours in vacuum at a pressure of $1\times10^{-2}$ Pa or less, and then transparent vitrifying the porous synthetic silica glass body.

In the process for producing the optical member for deep ultraviolet according to the present invention, it is preferred that, after synthesizing the porous synthetic silica glass body having a volume average bulk density of 0.33 g·cm$^{-3}$ or more and a variation in the bulk density of 0.1 g·cm$^{-3}$ or less, the porous synthetic silica glass body is subjected to the heat treatment.

Advantage of the Invention

The optical member for deep ultraviolet of the present invention has excellent transmission characteristics of deep ultraviolet and reduced compaction associated with deep ultraviolet irradiation, and is therefore preferred as an optical member for deep ultraviolet, such as an optical member of an exposure device employing deep ultraviolet as an exposing source.

MODE FOR CARRYING OUT THE INVENTION

The optical member for deep ultraviolet of the present invention contains synthetic silica glass which does not substantially contain an halogen element, has a maximum OH content of less than 10 ppm by mass, has contents of ODC (oxygen deficient centers) and E-prime center (Si.) of each less than $1 \times 10^{14}$ cm$^{-3}$, does not substantially contain SiH and peroxy linkage, and has a fictive temperature of 1,050° C. or lower.

ODC (oxygen deficient centers) used in the description includes any one of ODC (I) (≡Si—Si≡) and ODC (II) (O=Si:), or both.

As described above, in the case that the synthetic silica glass contains fluorine element, phenomenon that is not preferred on optical characteristics, such as striae and refractive index distribution, occurs. Furthermore, a part of fluorine is liberated with the progress of irradiation with deep ultraviolet, is released as $F_2$ having high etching ability from the surface, and adversely affects an exposure device using the synthetic silica glass as an optical member. In particular, in the case that OH group or $H_2$ molecule are present in the vicinity of fluorine atom, HF molecule is generated, and thereby defects such as E-prime center easily occur, which is not preferred.

On the other hand, where the synthetic silica glass contains chlorine element, not only transmission of deep ultraviolet is decreased, but decrease in transmission or variation in refractive index occurs with the progress of irradiation with deep ultraviolet, resulting in decrease in durability to deep ultraviolet. This is not preferred. In particular, in the case that OH group or $H_2$ molecule are present in the vicinity of chlorine atom, HCl molecule is generated, and thereby defects such as E-prime center easily occur, which is not preferred.

In the optical member for deep ultraviolet of the present invention, since the synthetic silica glass does not substantially contain those halogen elements, the above problems are solved.

The phrase "synthetic silica glass does not substantially contain a halogen element" used herein means that the content of a halogen element in the case of measured by a detection method of each halogen element described hereinafter is less than the detection limit. Only the detection methods of fluorine and chlorine are described as the detection method of a halogen element. However, the other halogen elements are substantially contained in the synthetic silica glass so long as the synthetic silica glass is produced by the method described hereinafter.

As described above, the present inventors have found that compaction associated with deep ultraviolet irradiation can be decreased by decreasing OH group content in the synthetic silica glass. The reason that compaction associated with deep ultraviolet irradiation can be decreased by decreasing OH group content in the synthetic silica glass is considered to be as follows.

As shown in the following formulae (3) and (4), in the case that other OH group or SiH is present in the vicinity of OH group, $H_2O$ molecule and Si—O—Si bond or Si—Si bond are formed by deep ultraviolet irradiation, and new crosslinking is formed, resulting in densification.

$$Si\text{—}OH + Si\text{—}OH \rightarrow Si\text{—}O\text{—}Si + H_2O \quad (3)$$

$$Si\text{—}OH + SiH \rightarrow Si\text{—}Si + H_2O \quad (4)$$

Therefore, decrease in OH group content is effective to decrease the compaction. As is apparent from the formula (4), decrease in SiH is also effective to decrease the compaction.

However, to exhibit the effect of decreasing the compaction due to the deep ultraviolet irradiation as described above, it is required that not only the OH group content in the synthetic silica glass is merely decreased, but also ODC content in the synthetic silica glass is less than $1 \times 10^{14}$ cm$^{-3}$, and SiH and a halogen element are not substantially contained therein.

In the case that the synthetic silica glass contains a halogen element, as shown in the following formula (5), where $H_2$ molecule is present in the vicinity of the halogen element, SiH which adversely affects compaction is generated together with halogen halide that causes formation of defects such as E-prime center. As a result, the effect of decreasing compaction associated with deep ultraviolet irradiation described above is not exhibited.

$$SiX + H_2 \rightarrow SiH + HX \quad (X \text{ is halogen element}) \quad (5)$$

In the case that ODC in an amount of $1 \times 10^{14}$ cm$^{-3}$ or more is contained in the synthetic silica glass, new crosslinking is formed, resulting in densification. This phenomenon can be explained as follows.

In the case of simultaneously absorbing two photons of deep ultraviolet (two-photon absorption), or in the case that an electron or a hole, captured in the energy level in band gap absorbs one photon, electron-hole pair is generated. In the case that the hole of those is captured by the adjacent ODC, E-prime center is formed as shown in the following formula (6). The E-prime center formed reacts with the adjacent Si—O—Si bond or a terminal group such as Si—OH to change network structure, thereby causing compaction.

$$Si\text{—}Si + H^+ \rightarrow Si. + Si^+ \quad (6)$$

Furthermore, charge localization occurs in network of a glass by electrons that have not been captured, and the charge localization may induce local stress. The stress decreases bonding strength of the adjacent Si—O, and paramagnetic defects such as E-prime center and NBOHC easily occur by laser irradiation. The paramagnetic defects increase absorbability of deep ultraviolet, and are therefore particularly not preferred in an optical silica glass for an exposure device. Furthermore, those paramagnetic defects bond to the adjacent bonding, thereby changing the network structure of the synthetic silica glass, and compaction may be induced.

For the above reasons, in the case that a halogen element and SiH are contained in the synthetic silica glass and in the case that ODC in an amount of $1 \times 10^{14}$ cm$^{-3}$ or more is contained in the synthetic silica glass, the effect of decreasing compaction due to decrease in OH group content are offset and is not exhibited.

(OH Group)

The maximum OH group content in the synthetic silica glass constituting an optical member for deep ultraviolet of the present invention is less than 10 ppm by mass. The term "maximum OH group content" used herein means a maximum value of OH group content in the synthetic silica glass generally having variation. The reason for controlling the maximum OH group content in the synthetic silica glass to less than 10 ppm by mass is that the content is preferred to exhibit the effect of decreasing compaction associated with deep ultraviolet irradiation as described above, and additionally, in the case that the maximum OH group content in the synthetic silica glass is 10 ppm by mass or more, peroxy linkage may be formed in the synthetic silica glass. As described above, where peroxy linkage is present in the synthetic silica glass, non-bridging oxygen hole center (NBOHC) may be formed when irradiating with deep ultraviolet, and may adversely affect optical characteristics of the synthetic silica glass by, for example, the increase in compaction, which is not preferred.

The maximum OH group content in the synthetic silica glass is preferably 8 ppm by mass or less, more preferably 5 ppm by mass or less, and particularly preferably 4 ppm by mass or less.

However, where the OH group content is excessively decreased, it becomes extremely difficult to suppress formation of reducing defects such as ODC, and additionally, viscosity of a glass is increased with decreasing the OH group content in the synthetic silica glass, and the distorted structure of combining network of the glass is difficult to be relaxed. Therefore, the maximum OH group content in the synthetic silica glass is preferably 1 ppm by mass or more.

(Variation in OH Group Content)

Where variation in OH group content in the synthetic silica glass constituting an optical member for deep ultraviolet is large, optical characteristics of the optical member for deep ultraviolet, specifically uniformity of refractive index, and birefringence are affected. Therefore, the variation in the OH group content in the synthetic silica glass is preferably small.

The variation in the OH group content in the synthetic silica glass constituting an optical member for deep ultraviolet of the present invention is preferably 5 ppm by mass or less, more preferably 3 ppm by mass or less, and further preferably 1 ppm by mass or less.

(Reducing Defect)

The content of reducing defects, that is, ODC, E-prime center and SiH, in the synthetic silica glass constituting an optical member for deep ultraviolet of the present invention is as follows.

The contents of ODC and E-prime center in the synthetic silica glass each are less than $1\times10^{14}$ cm$^{-3}$, and SiH is not substantially contained.

The E-prime center has absorption center at a wavelength of 215 nm. Therefore, where the E-prime center is present in an amount of $1\times10^{14}$ cm$^{-3}$ or more in a synthetic silica glass, transmission of deep ultraviolet is decreased. Furthermore, where the E-prime center is present in an amount of $1\times10^{14}$ cm$^{-3}$ or more in a synthetic silica glass, the E-prime center may change network structure of the synthetic silica glass by bonding to the adjacent bonding when irradiating with deep ultraviolet, and may adversely affect optical characteristics of the synthetic silica glass by, for example, increase in compaction.

The E-prime center content is preferably less than $1\times10^{13}$ cm$^{-3}$, and more preferably less than $5\times10^{12}$ cm$^{-3}$.

Where ODC is present in an amount of $1\times10^{14}$ cm$^{-3}$ or more in a synthetic silica glass, the E-prime center is generated from the ODC when irradiating with deep ultraviolet, and there may be caused the problems of decrease in deep ultraviolet transmission, occurrence of compaction, and the like described above. Furthermore, where ODC is present in an amount of $1\times10^{14}$ cm$^{-3}$ or more in the synthetic silica glass, two-photon absorption is induced when irradiating with deep ultraviolet. Since the decrease in transmission derived from the two-photon absorption depends on irradiation fluence of deep ultraviolet, the decrease becomes remarkable problem in the case that irradiation fluence is large.

The content of ODC is preferably less than $1\times10^{13}$ cm$^{-3}$, and more preferably less than $5\times10^{12}$ cm$^{-3}$.

Where SiH is present in the synthetic silica glass, E-prime center is generated from the SiH when irradiating with deep ultraviolet, and there may be caused the problems of decrease in deep ultraviolet transmission, occurrence of compaction, and the like described above. Furthermore, where SiH is present in the synthetic silica glass, two-photon absorption is induced when irradiating with deep ultraviolet. Since, the decrease in transmission derived from the two-photon absorption depends on irradiation fluence of deep ultraviolet, the decrease becomes remarkable problem in the case that the irradiation fluence is large.

The content of SiH is measured by conducting semi-quantitative evaluation by Raman scattering method described hereinafter. In the case that the content is lower than the lower detection limit, it is considered that the SiH is not substantially contained.

(Peroxy Linkage)

As described above, peroxy linkage dissociates by irradiation with deep ultraviolet to generate NBOHC. However, since the maximum OH group content in the synthetic silica glass constituting an optical member for deep ultraviolet of the present invention is less than 10 ppm by mass, the peroxy linkage is prevented from being formed in the synthetic silica glass. As a result, the synthetic silica glass constituting an optical member for deep ultraviolet of the present invention does not substantially contain the peroxy linkage.

The content of the peroxy linkage is measured with infrared spectrophotometer as described hereinafter. In the case that the content is lower than the lower detection limit, it is considered that the peroxy linkage is not substantially contained.

(Fictive Temperature)

The optical member for deep ultraviolet of the present invention has a synthetic silica glass which constitutes the optical member for deep ultraviolet and has a fictive temperature of 1,050° C. or lower.

Where the fictive temperature of the synthetic silica glass exceeds 1,050° C., many three-membered rings and four-membered rings, which have distorted structures, are contained in combining network of the glass, and as a result, durability to deep ultraviolet irradiation becomes insufficient. The fictive temperature of the synthetic silica glass is preferably 1,040° C. or lower, and more preferably 1,020° C. or lower.

To increase homogeneity of refractive index, variation in the fictive temperature is preferably 5° C. or less, more preferably 3° C. or less, and further preferably 1° C. or less.

(Metal Impurities)

In the optical member for deep ultraviolet of the present invention, metal impurities such as Li, Na, Mg, Al, K, Ca, Ti, V, Cr, Mn, Fe, Co, Ni, Cu, Zn, Ge, Mo, Ag, Cd, Sn, Ce and Pb in a synthetic silica glass constituting the optical member for deep ultraviolet not only decrease deep ultraviolet transmission, but also become the cause to deteriorate durability to deep ultraviolet irradiation. Therefore, the content is preferably as small as possible. Specifically, the total content of metal impurities of the above 22 elements in the synthetic silica glass is preferably 20 ppb by mass or less, more preferably 5 ppb by mass or less, and further preferably 1 ppb by mass or less.

The optical member for deep ultraviolet of the present invention is excellent in deep ultraviolet transmission and prevented from decrease in transmission by deep ultraviolet irradiation because a synthetic silica glass constituting the optical member for deep ultraviolet has the above composition. Specifically, in the case of measuring deep ultraviolet transmission, initial transmission per 1 cm optical path length to a wavelength of 193 nm is preferably 99.75% or more, more preferably 99.77% or more, further preferably 99.80% or more, and most preferably 99.83% or more.

Furthermore, the transmission per 1 cm optical path length to a wavelength of 193 nm after $1\times10^{10}$ pulse irradiation of linearly polarized deep ultraviolet pulse laser of, for example, 193 nm, 0.5 mJ·cm$^{-2}$·pulse$^{-1}$, 20 ns, and 4 kHz, is preferably 99.40% or more, more preferably 99.48% or more, further preferably 99.57% or more, and most preferably 99.66% or more.

In the optical member for deep ultraviolet of the present invention, compaction associated with linearly polarized deep ultraviolet pulse laser irradiation is decreased because a synthetic silica glass constituting the optical member for deep ultraviolet has the above composition. Specifically, in the case of measuring the compaction associated with linearly polarized deep ultraviolet pulse laser irradiation under the above irradiation conditions, the compaction is preferably 300 ppb or less, more preferably 200 ppb or less, and further preferably 100 ppb or less.

Furthermore, in the optical member for deep ultraviolet of the present invention, polarization induced birefringence (PIB) associated with linearly polarized deep ultraviolet pulse laser irradiation is reduced because a synthetic silica glass constituting the optical member for deep ultraviolet has the above composition. Specifically, in the case of measuring the PIB associated with linearly polarized deep ultraviolet pulse laser irradiation under the above irradiation conditions, the PIB is preferably 0.3 nm·cm$^{-1}$ or less, more preferably 0.2 nm·cm$^{-1}$ or less, and further preferably 0.1 nm·cm$^{-1}$ or less.

The process for producing an optical member for deep ultraviolet of the present invention is described below.

Silicon compound used as a raw material of a porous synthetic silica glass body is not particularly limited so long as it can be gasified. Chlorides such as $SiCl_4$, $SiHCl_3$, $SiH_2Cl_2$ and $Si(CH_3)Cl_3$, and fluorides such as $SiF_4$, $SiHF_3$ and $SiH_2F_2$ are preferred from the view points of workability and costs.

The porous synthetic silica glass body can be synthesized by introducing these silicon compounds in an oxyhydrogen flame to perform flame hydrolysis, and depositing and growing the synthetic silica glass fine particles synthesized on a substrate. The substrate on which the synthetic silica glass fine particles are deposited is preferably rotated in order to decrease variation in bulk density of a porous synthetic silica glass body to be synthesized. The rotation speed of the substrate is typically in a range of from 0.1 to 10 rpm, although depending on deposition speed of the synthetic silica glass fine particles.

In the process for producing an optical member for deep ultraviolet of the present invention, a volume average bulk density of the porous synthetic silica glass body synthesized by the above procedures is 0.33 g·cm$^{-3}$ or more. The volume average bulk density of the porous synthetic silica glass body described above means a volume average bulk density of the porous synthetic silica glass body just after the synthesis.

Increasing the volume average bulk density of the porous synthetic silica glass body synthesized by the above procedures can be achieved by increasing surface temperature of a growth surface of the porous synthetic silica glass body when synthetic silica glass fine particles are deposited and grown on a substrate. Increasing the surface temperature of the growth surface of the porous synthetic silica glass body can be achieved by increasing temperature of oxyhydrogen flame. Increasing the temperature of oxyhydrogen flame can be achieved by increasing combustion gas fed to a burner.

However, in the case of simply increasing the surface temperature of the growth surface of the porous synthetic silica glass body, thermophoresis effect on the growth surface is decreased, the synthetic silica glass fine particles cannot be deposited on the substrate, and a porous synthetic silica glass body cannot be synthesized. For this reason, to prevent decrease in the thermophoresis effect on the growth surface, flame temperature must be set further higher than the surface temperature of the growth surface, while maintaining the surface temperature of the growth surface at high and uniform temperature.

By controlling the volume average bulk density of the porous synthetic silica glass body to 0.33 g·cm$^{-3}$ or more, sufficient mechanical strength can be imparted to the porous synthetic silica glass body, making the handling easy, and additionally, decrease in the OH group content and decrease in the variation in the OH group content in the porous synthetic silica glass body can be effectively performed in a heat treatment described hereinafter.

The volume average bulk density of the porous synthetic silica glass body is more preferably 0.35 g·cm$^{-3}$ or more, and further preferably 0.37 g·cm$^{-3}$ or more.

From the view point of decrease in the variation in the OH group content in the porous synthetic silica glass body, it is preferred that variation in the bulk density in the porous synthetic silica glass body is small. When obtaining the variation in bulk density, a region excluding a region within a depth of 50 mm from the outermost surface of the porous synthetic silica glass body is intended. The variation in the bulk density in the porous synthetic silica glass body is preferably 0.1 g·cm$^{-3}$ or less, and more preferably 0.05 g·cm$^{-3}$ or less.

The porous synthetic silica glass body obtained by the above procedures is relatively brittle, and is therefore pre-sintered. The pre-sintering is typically carried out at a temperature of from about 1,300 to 1,400° C. for several hours in the air atmosphere.

Subsequently, the porous synthetic silica glass body obtained by the above procedures is subjected to heat treatment at a temperature in a range of from 1,050 to 1,250° C. for a period of time exceeding 90 hours in vacuum at a pressure of $1\times10^{-2}$ Pa or less. By the heat treatment, the OH group content in the porous synthetic silica glass body is decreased, and variation in the OH group content is decreased. As a result, the maximum OH group content in the synthetic silica glass after transparent vitrification becomes less than 10 ppm by mass. The variation in the OH group content in the synthetic silica glass easily becomes 3 ppm by mass or less, preferably 2 ppm by mass or less, and more preferably 1 ppm by mass or less. This step has an object to decrease the OH group content in a synthetic silica glass, and is therefore hereinafter referred to as "dehydration treatment" in the description.

The following factors are considered as the reasons that the OH group content in the porous synthetic silica glass body is decreased and the variation in the OH group content is reduced.

When the porous synthetic silica glass body is subjected to dehydration treatment at a temperature in a range of from 1,050 to 1,250° C., a reaction shown in the following formula (7) proceeds in rightward, and $H_2O$ molecule dissociates from hydrogen-bonded Si—OH group pair in the porous synthetic silica glass body and is discharged to the outside of the porous synthetic silica glass body.

In the case that a degree of vacuum at this time is low (ambient pressure is high), partial pressure of CO molecule or other gas molecule having reduction ability is increased, and reducing defects (Si—H, and ODC (≡Si—Si≡)) are by-produced in the porous synthetic silica glass body as shown in the following formulae (8) and (9). Therefore, formation of reducing defects can be suppressed by carrying out the heat treatment in vacuum at a pressure of $1 \times 10^{-2}$ Pa or less to thereby decrease the partial pressure of CO molecule or other gas molecule having reduction ability.

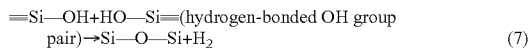

(7)

(8)

(9)

By carrying out the dehydration treatment in a vacuum at a pressure of $1 \times 10^{-2}$ Pa or less, the decrease in the OH group content and the decrease in the variation in the OH group content in the porous synthetic silica glass body can be effectively performed. The dehydration treatment is more preferably carried out in vacuum at $3 \times 10^{-3}$ Pa or less, and further preferably carried out in vacuum at $1 \times 10^{-3}$ Pa or less.

Temperature range at the dehydration treatment is from 1,050 to 1,250° C. Where the temperature is lower than 1,050° C., relatively long period of time is required until the decrease in the OH group content and the decrease in the variation in the OH group content in the porous synthetic silica glass body are sufficiently performed, and productivity may be deteriorated. On the other hand, where the temperature exceeds 1,250° C., vitrification proceeds from the surface of the porous synthetic silica glass body, and the decrease in the OH group content may not be sufficiently performed. Furthermore, reactivity with a reducing gas molecule such as CO in the gas phase is increased, and reducing defects may easily occur. The dehydration treatment temperature is preferably low such that the volume average bulk density just after the dehydration treatment described hereinafter is not increased. On the other hand, the lower limit temperature is preferably set such that elimination reaction of Si—OH group efficiently proceeds. Therefore, the dehydration treatment temperature is preferably from 1,080 to 1,225° C., and more preferably from 1,100 to 1,200° C.

By carrying out the dehydration treatment under the above-described pressure conditions and temperature conditions for a period of time exceeding 90 hours, the decrease in the OH group content and the decrease in the variation in the group content in the porous synthetic silica glass body can be effectively performed.

The dehydration treatment is carried out for preferably 100 hours or more, more preferably 120 hours or more, further preferably 140 hours or more, and particularly preferably 160 hours or more.

However, where the dehydration treatment is carried out for a period of time exceeding 250 hours, reducing defects may be formed in the synthetic silica glass even if the degree of vacuum at the time of carrying out the dehydration treatment is increased (pressure is decreased). Therefore, the dehydration treatment is carried out for preferably 250 hours or less.

The porous synthetic silica glass body after the dehydration treatment preferably has volume average bulk density of less than 1.6 g·cm$^{-3}$. Where the volume average bulk density of the porous synthetic silica glass body after the dehydration treatment is 1.6 g·cm$^{-3}$ or more, discharge of $H_2O$ molecule to the outside of the porous synthetic silica glass body at the dehydration treatment may not be sufficiently carried out, and the maximum OH group content may not reach less than 10 ppm by mass. The porous synthetic silica glass body after the dehydration treatment has the volume average bulk density of more preferably 1.2 g·cm$^{-3}$ or less, and further preferably 0.8 g·cm$^{-3}$ or less.

The porous synthetic silica glass body after the dehydration treatment is then subjected to transparent vitrification to prepare synthetic silica glass. Transparent vitrification of the porous synthetic silica glass body can be achieved by heating the porous synthetic silica glass body to a vitrification temperature or higher. The transparent vitrification treatment and the above-described dehydration treatment may be carried out in other heating apparatuses, respectively. In such a case, such a countermeasure that, for example, water is prevented from being adsorbed during transportation is preferably taken. More preferably, the transparent vitrification and the dehydration treatment are carried out in the same heating apparatus.

The synthetic silica glass after the transparent vitrification is heated to a temperature of softening point or higher in a mold frame in the aim of molding into a desired shape, and molded into a mold frame shape.

To control a fictive temperature to 1,050° C. or lower, annealing is preferably carried out under given conditions. To control the fictive temperature of the synthetic silica glass to 1,050° C. or lower, the maximum temperature in an annealing step is set so as to be an annealing point of the synthetic silica glass or higher, and the synthetic silica glass is held for a sufficient period of time, and then gradually cooled to a temperature of 1,050° C. or lower. Cooling rate of from the maximum treatment temperature to a temperature of 1,050° C. or lower is desirable that annealing is carried out more slowly with decreasing the temperature. It is preferred that a cooling region at which a cooling rate is 0.3° C.·hr$^{-1}$ or less is present in a section of 1,100° C. or lower and 850° C. or higher, and it is more preferred that a cooling region at which a cooling rate is 0.1° C.·hr$^{-1}$ or less is present in the section. On the other hand, in a temperature region of 850° C. or lower, structure relaxation of glass does not virtually proceeds, and therefore, annealing is not required.

The annealing treatment requires long treatment time. Therefore, it is preferred to use a clean heat treatment furnace free of metal contamination, and it is preferred to previously clean the synthetic silica glass to be treated.

To impregnate the synthetic silica glass with hydrogen, heat treatment in hydrogen atmosphere may be carried out after carrying out the annealing treatment. Temperature of the heat treatment is preferably 600° C. or lower, more preferably 500° C. or lower, and further preferably 450° C. or lower. The heat treatment in hydrogen atmosphere is preferably carried out at a pressure of from 101 to 1,013 kPa using an inert gas containing hydrogen gas in an amount of from 10 to 100 vol %. In the case of impregnating with hydrogen, hydrogen molecule content is preferably from $5 \times 10^{15}$ to $5 \times 10^{17}$/cm$^3$, and further preferably from $8 \times 10^{15}$ to $2 \times 10^{17}$/cm$^3$.

EXAMPLES

Example 1

SiCl$_4$ as a silicon compound was introduced in oxyhydrogen flame and subjected to flame hydrolysis. The synthetic silica glass fine particles thus synthesized were deposited on a substrate rotating at 5 revolutions per minutes to prepare a nearly cylindrical porous synthetic silica glass body (according to a measurement method described hereinafter, diameter: 450 mm, length: 1,000 mm, and volume: 159,000 cm³). In this case, gas flow rate was 550 liters per minute in total of hydrogen and oxygen. Weight of the porous synthetic silica glass body prepared was measured in accordance with the following method after pre-sintering, and was 54.1 kg. Volume average bulk density was calculated as 0.34 g·cm⁻³ from the above volume and weight. From the following evaluation method, variation in the bulk density was 0.03 g·cm⁻³.

Next, the porous synthetic silica glass body prepared was pre-sintered at 1,350° C. for 3 hours in the air atmosphere. The volume average bulk density of the porous synthetic silica glass body after pre-sintering was 0.47 g·cm⁻³. The volume average bulk density of the porous synthetic silica glass body just after synthesis and after the pre-sintering, and the variation in bulk density were measured by the following procedures.

(Volume Average Bulk Density)

Diameter and length of a nearly cylindrical porous synthetic silica glass body just after synthesis were measured with a con-contact type dimension measuring instrument. In this case, the diameter and length were measured at three sites, respectively, in order that variation in the each dimension can sufficiently be considered, and average values of the diameter and length were calculated, respectively. The length was measured considering a position to be cut for removing a substrate for deposition after pre-sintering. Assuming that the porous synthetic silica glass body just after synthesis has a completely cylindrical shape, volume of the cylinder of the porous synthetic silica glass body just after synthesis was obtained using the above average diameter and average length. Volume of a porous synthetic silica glass body after pre-sintering was obtained in the same method as above. After removing the substrate for deposition from the porous synthetic silica glass body after pre-sintering, mass was measured with a platform scale. A value obtained by dividing the mass by the volume of the porous synthetic silica glass body just after synthesis was taken as a volume average bulk density of the porous synthetic silica glass body just after synthesis, and a value obtained by dividing the mass by the volume of the porous synthetic silica glass body after pre-sintering was taken as a volume average bulk density of the porous synthetic silica glass body after pre-sintering.

(Variation in Bulk Density)

A porous synthetic silica glass body just after synthesis was prepared so as to have nearly the same dimensions under the same synthesis conditions as in the porous synthetic silica glass body from which the volume average bulk density was obtained, nine cubic blocks having a size of 30 mm cube were prepared by cut out therefrom, the respective masses thereof were measured with a precision balance to obtain bulk density of the individual blocks, and the difference between the maximum value and the minimum value was taken as variation. Here, the nine blocks were prepared by cutting out three blocks per a cross-section surface form cross-section surfaces at nearly equal intervals on a radius line toward outer periphery from a center axis of the cylindrical body, in which the cross-section surfaces were obtained by cutting the cylindrical body into round at three positions in total of the center of the cylindrical body and areas within 100 mm from both ends of the cylindrical body. However, a region within 50 mm depth from the outermost peripheral surface of the cylindrical porous synthetic silica glass body just after synthesis has extremely poor strength, and it is difficult to cut out a cubic block from the region. For this reason, the region was eliminated from the evaluation.

Next, the porous synthetic silica glass body was heat-treated under the following conditions.

The porous synthetic silica glass body after pre-sintering and removing substrate for deposition, was subjected to dehydration treatment by heating at a temperature of 1,220° C. for 108 hours under a pressure of 2×10⁻³ Pa (absolute pressure). The temperature was then increased to 1,450° C. to completely sinter the glass body, thereby performing transparent vitrification. In this case, the volume average bulk density after the dehydration treatment was 0.96 g·cm⁻³. The volume average bulk density after dehydration treatment was obtained by measuring the volume and mass of the porous synthetic silica glass body which was synthesized, pre-sintered and dehydration-treated under the same conditions, in the above measurement methods. The transparent-vitrified synthetic silica glass was placed in a mold frame, and held therein at 1,800° C. for 4 hours, thereby molding into a cylindrical shape having a diameter of 500 mm and a thickness of 110 mm.

The resulting molded body was subjected to annealing under the following conditions.

(Annealing Conditions)

The synthetic silica glass molded body was heated to 1,300° C. in vacuum atmosphere, held for 30 hours, then cooled to 1,100° C. at a rate of 2° C. per hour, and further cooled to 850° C. at a rate of 0.25° C. per hour. Thereafter, electric supply to a heater was stopped, and the molded body was cooled to room temperature in an annealing furnace.

(Hydrogen Molecule Impregnation Conditions)

After annealing, heat treatment was carried out at 500° C. in an atmosphere having hydrogen partial pressure of 1×10⁴ Pa. Thereafter, a sample having 25 mm×25 mm×100 mm was cut out of near the center of the synthetic silica glass, and the two surfaces of 25 mm square were polished. The sample was irradiated with ArF excimer laser (193 nm) for up to 1×10¹⁰ pulse under irradiation conditions of 0.5 mJ·cm⁻²·pulse⁻¹, 20 ns and 4 kHz, so as to pass the two polished surfaces of the sample.

(Measurement Results of Physical Properties)

Physical property values of the synthetic silica glass body having been subjected to all of the above steps were measured, and are shown in Table 1.

Evaluation results shown in Table 1 were performed by the following methods.

(OH Group Content)

OH group content was measured by the following method. Using an infrared spectrophotometer (NICOLET 6700 manufactured by Thermo Electron Corporation), infrared light was passed through a synthetic silica glass to be measured, and OH group content was obtained from absorption peak which appeared at a wavelength of about 2.7 μm of absorption spectrum observed at a transmitted light outlet (J. P. Williams et. al., Ceramic Bulletin, 55 (5), 524, 1976). The detection limit by this method is about 0.3 ppm by mass. In the case of the cylindrical shape, the measurement was conducted by entering infrared light vertically to a circular main surface of the synthetic silica glass, and scanning on one line segment corresponding to a diameter of the main surface at an interval of 10 mm. In the case of a rectangular column shape, the measurement was conducted on a rectangular main surface of the synthetic silica glass by scanning on one line segment passing a point that diagonals on the main surface intersect, at an interval of 10 mm. The maximum OH group content measured on the scanning line is defined as maximum OH group content, and difference between the maximum value and the minimum value is defined as variation in OH group content.

(ODC Content)

Content of ODC in a synthetic silica glass can be obtained from intensity of fluorescence having a peak in the vicinity of from 280 to 300 nm in irradiating the synthetic silica glass with deep ultraviolet. The relationship between ratio of the fluorescence intensity and ODC in the synthetic silica glass is obtained by utilizing absorption zone by $C_{ODC}$ centering 163 nm. That is, in accordance with the literature (H. Hosono et. al., Phys. Rev. B44, p 12043 (1991)), $C_{ODC}$ is obtained by absorption intensity at a wavelength of 163 nm, fluorescence intensity of a synthetic silica glass sample having known $C_{ODC}$ is measured in accordance with the literature (M. Ono et. al., Conference on Lasers and Electro-Optics, OSA Technical Digest, 2009, CTuO 4), and the relationship between fluorescence intensity I and $C_{ODC}$ (cm$^{-3}$) can be obtained as the following equation.

$$C_{ODC}(\text{cm}^{-3}) = C_{ODC\,known}(\text{cm}^{-3}) \times I/I_{known}$$

The fluorescence intensity I is generally arbitrary unit. However, in the case that a sample having known ODC content ($1 \times 10^{14}$ cm$^{-3}$) was measured by the measurement device used by the present inventors, the fluorescence intensity was 8.4 arbitrary unit. The detection limit by this method is $5 \times 10^{12}$ cm$^{-3}$.

(E-Prime Center Content)

Content of the E-prime center is obtained by ESR method. Specifically, the content was measured in accordance with the method shown in the literature (M. Ono et. al., Conference on Lasers and Electro-Optics, OSA, technical Digest, 2009, CTuO 4). The detection limit by this method was $5 \times 10^{12}$ cm$^{-3}$.

(SiH Content)

Content of SiH in a synthetic silica glass can be obtained by subjecting the synthetic silica glass to Raman analysis and evaluating peak intensity by SiH in the vicinity of 2,250 cm$^{-1}$. Sample piece having 20 mm square×10 mm length was cut out of near the center of a synthetic silica glass, and the two surfaces of 20 mm square of the sample piece were mirror-polished. The sample piece was irradiated with second harmonic (wavelength: 532 nm) of YAG laser as excitation light so as to pass the two polished surfaces of the sample and to enter at about 30° to a normal direction of the surface. SiH can be semi-quantitatively evaluated by a value $I_{2250}/I_{800}$ obtained by dividing peak intensity $I_{2250}$ at 2250 cm$^{-1}$ which is Raman scattering light derived from SiH by peak intensity $I_{800}$ at 800 cm$^{-1}$ which is Raman scattering light derived from Si—O fundamental oscillation. The detection limit by this method is $1 \times 10^{-4}$ in Raman peak ratio ($I_{2250}/I_{800}$)

(Peroxy Linkage Content)

Sample piece having 10 mm square×100 mm length was cut out of near the center of a synthetic silica glass body, the sample piece is held at 800° C. for 100 hours in an atmosphere of 100% of hydrogen gas and 101 kPa, and OH group content which has increased before and after the above heat treatment is measured with an infrared spectrophotometer in accordance with the literature (Cer. Bull., 55 (5), 524, (1976)). Content $C_{POL}$ (cm$^{-3}$) of the peroxy linkage is calculated from increased OH group content $\Delta C_{OH}$ (cm$^{-3}$) by the following equation.

$$C_{POL} = \Delta C_{OH} \times 0.5$$

The detection limit by this method is $1 \times 10^{16}$ cm$^{-3}$.

(Fluorine Content)

Fluorine content near the center of a synthetic silica glass body was analyzed by fluorine ion electrode method. The analysis method of the fluorine content is as follows. In accordance with the method described in the literature (Journal of The Chemical Sciety of Japan, 1972 (2), p 350), synthetic silica glass was heat-melted by anhydrous sodium carbonate, and distilled water and hydrochloric acid (1:1 in volume ratio) were added to the resulting melt to prepare a sample liquid. Electromotive force of the sample liquid was measured with a radiometer using No. 945-220 and No. 945-468 manufactured by Radiometer Trading as a fluorine ion-selective electrode and a comparative electrode, respectively, and the fluorine content was obtained based on a calibration curve previously prepared using a fluorine ion standard solution. The detection limit by this method is 10 ppm by mass.

(Chlorine Content)

Analysis was conducted using neutron activation analysis. Specifically, the analyst was conducted by the method described in the literature (Analytical Chemistry, Vol. 40, p. 549-555 (1991)). The detection limit by this method is 10 ppb by mass.

(Metal Impurity Content)

Content of metal impurities contained in a synthetic silica glass is measured as follows. About 10 g of a synthetic silica glass sample to be measured is collected, and pulverized in a size of several mm using a hammer or the like. The pulverized sample is sufficiently cleaned with an acid, and completely dissolved using hydrofluoric acid, followed by evaporation by heating. Residue after evaporation is extracted with an acid, and metal ion concentration in the extract is measured with ICP mass analysis. Quantification is conducted by a calibration curve prepared using NIST traceable standard liquid. Evaluation elements in this method are Li, Na, Mg, Al, K, Ca, Ti, V, Cr, Mn, Fe, Co, Ni, Cu, Zn, Ge, Mo, Ag, Cd, Sn, Ce and Pb. The detection limit of each element is a range of from 0.3 to 0.6 ppb by mass, although varying depending on the element. A value of total of measurement values of elements in which contents of the detection limit or more were measured is defined as metal impurity content.

(Fictive Temperature)

Fictive temperature of a synthetic silica glass was measured by the following procedures.

For a mirror-polished synthetic silica glass sample having 15 mm×15 mm×2 mm thickness, absorption spectrum of infrared transmitted light at near the center position of the sample is obtained using infrared spectrophotometer (MAGNA 760 manufactured by Nikolet). In this case, data interval was set to about 4 cm$^{-1}$, and an average value obtained by scanning 256 times was used as the absorption spectrum. In the infrared absorption spectrum thus obtained, the peak observed in the vicinity of about 2,260 cm$^{-1}$ is due to harmonic of stretching vibration by Si—O—Si bond of a synthetic silica glass, and the fictive temperature can be obtained from the peak position. In this case, a calibration curve had previously been obtained by the following method. A synthetic silica glass sample having the same size as above was held at a certain temperature for a sufficiently long period of time, the synthetic silica glass sample was then quenched and thereafter, transmission absorption spectrum thereof was obtained in the same manner as above. In this case, the holding temperature can considered to be a fictive temperature of the synthetic silica glass sample. Furthermore, plural samples prepared changing the holding temperature was provided, and the respective transmission absorption spectra were obtained. Thus, regression line between harmonic peak position and a fictive temperature was obtained, and this was defined as the calibration curve.

(Variation in Fictive Temperature)

Variation in the fictive temperature of a synthetic silica glass is defined as follows. Samples having the size described above were cut out of three sites in total of the center point, the point 20 mm inner from the periphery, and the intermediate point of those, on the circular surface vertical to the light axis of a synthetic silica glass such that those three points are located at nearly the center, respectively, and polished. The fictive temperatures of the three samples were measured by the above method, and difference between the maximum value and the minimum value of the temperatures at three points was defined as variation in the fictive temperature.
(Hydrogen Molecule Content)

Sample piece having 10 mm square×5 mm thickness was cut out of the vicinity of the center of a synthetic silica glass body, and the two 10 mm square main surfaces were polished. For the mirror-polished sample, hydrogen molecule content in the glass was measured by the following method using Raman spectrometric device. Similar to the measurement method of SiH content, second harmonic of YAG laser was penetrated through the two polished surfaces at an angle inclined about 30° from a normal line of the surfaces. Hydrogen molecule content ($cm^{-3}$) was obtained from intensity ratio ($=I_{4160}/I_{800}$) between intensity $I_{4160}$ detected by the peak appeared in the vicinity of 4,135 $cm^{-1}$ of Raman spectrum and intensity $I_{800}$ of a peak at 800 $cm^{-1}$ which is Raman scatter peak derived from fundamental vibration of Si—O bond (V. S. Khotimchenko, et. al., Zhurnal Prikladnoi Spektroskopii, Vol. 46, No. 6, PP. 987-997, 1986). The detection limit by this method is about $3 \times 10^{15}$ $cm^{-3}$.
(Initial Transmission and Transmission after Irradiation)

Sample having 25×25×100 mm was cut out of the vicinity of the center of a synthetic silica glass body, and the two surfaces of 25 mm×25 mm were polished. Transmission of the sample at 193 nm before excimer laser irradiation was measured through the surface of 25 mm×25 mm with spectral transmission measuring device (Cary 500), and this transmission was taken as initial transmission. Thereafter, the surface of 25 mm×25 mm was irradiated with linearly polarized ArF excimer laser (wavelength: about 193 nm, pulse time width: about 20 ns, 0.5 m·J·$cm^{-2}$·$pulse^{-1}$) for $1 \times 10^{10}$ pulse. The ArF laser beam was adjusted its optical system such that its cross-section becomes a circle having a diameter of 3.5 mm and laser fluence becomes uniform in a range of a beam diameter. After the irradiation, transmission at 193 nm was measured in the circular region having a diameter of 3.0 mm which is coaxial with the irradiated part, in the same manner as above, using the spectral transmission measuring device, and the transmission was taken as transmission after irradiation.
(Compaction Associated with Deep Ultraviolet Irradiation)

On the surface of 25 mm×25 mm of the synthetic silica glass sample after excimer laser irradiation as above, refractive index distribution of a region including the irradiated part and the periphery thereof was measured using Fizeau interferometer, and difference to refractive index distribution previously measured before irradiation was obtained (about 0.1 mm grid). Of the difference, an average value of magnitude of difference in the circular region having a diameter of 3.0 mm which is coaxial with the irradiated part is defined as magnitude of compaction. Measurement wavelength of the refractive index distribution is 633 nm.
(Polarization Induced Birefringence by Irradiation with Polarized Deep Ultraviolet: PIB)

On the surface of 25 mm×25 mm of the synthetic silica glass sample after excimer laser irradiation as above, birefringence distribution of a region including the irradiated part and the periphery thereof was measured (0.5 mm grid), and difference to the birefringence distribution previously measured before irradiation was obtained. Of the difference, an average value of magnitude of the difference at the center of the circular region having a diameter of 1.5 mm which is coaxial with the irradiated part is defined as polarization induced birefringence (PIB). Measurement wavelength of the birefringence is 633 nm.

Example 2

A porous synthetic silica glass body was prepared and evaluated in the same manners as in Example 1, except that total flow rate of oxygen and hydrogen gas was increased 5% compared with the total flow rate in Example 1, the dehydration treatment time in the vitrification step was changed to 132 hours, and the annealing rate in the section of from 1,100° C. to 850° C. was changed to 0.05° C.·$hr^{-1}$. As a result, volume average bulk density just after synthesis was 0.36 g·$cm^{-3}$, variation in bulk density was 0.04 g·$cm^{-3}$, volume average bulk density after pre-sintering was 0.50 g·$cm^{-3}$, and volume average bulk density after dehydration treatment in the vitrification step was 1.10 g·$cm^{-3}$.

Physical property values of the synthetic silica glass body having been subjected to all of the above steps were measured, and are shown in Table 1.

Example 3

A porous synthetic silica glass body was prepared and evaluated in the same manners as in Example 1, except that total flow rate of oxygen and hydrogen gas was increased 10% compared with the total flow rate in Example 1, the dehydration treatment temperature in the vitrification step was changed to 1,180° C., the dehydration treatment time was changed to 168 hours, the degree of vacuum in the dehydration treatment was controlled to $5 \times 10^{-3}$ Pa, the annealing rate in the section of from 1,100° C. to 850° C. was changed to 0.05° C.·$hr^{-1}$, and the hydrogen partial pressure in the hydrogen impregnation step was changed to $5 \times 10^4$ Pa. As a result, volume average bulk density just after synthesis was 0.38 g·$cm^{-3}$, variation in bulk density was 0.08 g·$cm^{-3}$, volume average bulk density after pre-sintering was 0.53 g·$cm^{-3}$, and volume average bulk density after dehydration treatment in the vitrification step was 0.68 g·$cm^{-3}$.

Physical property values of the synthetic silica glass body having been subjected to all of the above steps were measured, and are shown in Table 1.

Example 4

A porous synthetic silica glass body was prepared and evaluated in the same manners as in Example 1, except that total flow rate of oxygen and hydrogen gas was increased 10% compared with the total flow rate in Example 1, the dehydration treatment temperature in the vitrification step was changed to 1,180° C., the dehydration treatment time was changed to 192 hours, the degree of vacuum in the dehydration treatment was controlled to $5 \times 10^{-4}$ Pa, and the hydrogen partial pressure in the hydrogen impregnation step was changed to $1 \times 10^5$ Pa. As a result, volume average bulk density just after synthesis was 0.38 g·$cm^{-3}$, variation in bulk density was 0.09 g·$cm^{-3}$, volume average bulk density after pre-sintering was 0.53 g·$cm^{-3}$, and volume average bulk density after the dehydration treatment in the vitrification step was 0.70 g·$cm^{-3}$.

Physical property values of the synthetic silica glass body having been subjected to all of the above steps were measured, and are shown in Table 1.

Comparative Example 1

A porous synthetic silica glass body was prepared and evaluated in the same manners as in Example 1, except that total flow rate of oxygen and hydrogen gas was decreased 5% compared with the total flow rate in Example 1, the dehydration treatment temperature in the vitrification step was changed to 1,260° C., the dehydration treatment time was changed to 60 hours, the degree of vacuum in the dehydration treatment was controlled to $3 \times 10^{-2}$ Pa, and the annealing rate in the section of from 1,100° C. to 850° C. was changed to 0.5° C.·hr$^{-1}$. As a result, volume average bulk density just after synthesis was 0.29 g·cm$^{-3}$, variation in bulk density was 0.01 g·cm$^{-3}$, volume average bulk density after pre-sintering was 0.40 g·cm$^{-3}$, and volume average bulk density after the dehydration treatment in the vitrification step was 1.62 g·cm$^{-3}$.

Physical property values of the synthetic silica glass body having been subjected to all of the above steps were measured, and are shown in Table 1.

Comparative Example 2

A porous synthetic silica glass body was prepared and evaluated in the same manners as in Example 1, except that total flow rate of oxygen and hydrogen gas was increased 5% compared with the total flow rate in Example 1, the dehydration treatment temperature in the vitrification step was changed to 1,180° C., the dehydration treatment time was changed to 132 hours, the degree of vacuum in the dehydration treatment was controlled to $5 \times 10^{-1}$ Pa, and the annealing rate in the section of from 1,100° C. to 850° C. was changed to 0.5° C.·hr$^{-1}$. As a result, volume average bulk density just after synthesis was 0.36 g·cm$^{-3}$, variation in bulk density was 0.05 g·cm$^{-3}$, volume average bulk density after pre-sintering was 0.50 g·cm$^{-3}$, and volume average bulk density after the dehydration treatment in the vitrification step was 0.62 g·cm$^{-3}$.

Physical property values of the synthetic silica glass body having been subjected to all of the above steps were measured, and are shown in Table 1.

Comparative Example 3

A porous synthetic silica glass body was prepared and evaluated in the same manners as in Example 1, except that total flow rate of oxygen and hydrogen gas was increased 13% compared with the total flow rate in Example 1, the dehydration treatment temperature in the vitrification step was changed to 1,180° C., the dehydration treatment time was changed to 288 hours, the degree of vacuum in the dehydration treatment was controlled to $2 \times 10^0$ Pa, and the annealing rate in the section of from 1,100° C. to 850° C. was changed to 0.5° C.·hr$^{-1}$. As a result, volume average bulk density just after synthesis was 0.40 g·cm$^{-3}$, variation in bulk density was 0.14 g·cm$^{-3}$, volume average bulk density after pre-sintering was 0.55 g·cm$^{-3}$, and volume average bulk density after the dehydration treatment in the vitrification step was 0.82 g·cm$^{-3}$.

Physical property values of the synthetic silica glass body having been subjected to all of the above steps were measured, and are shown in Table 1.

Comparative Example 4

A porous synthetic silica glass body was prepared and evaluated in the same manners as in Example 1, except that total flow rate of oxygen and hydrogen gas was increased 5% compared with the total flow rate in Example 1, the dehydration treatment time in the vitrification step was changed to 132 hours, the degree of vacuum in the dehydration treatment was controlled to $1 \times 10^0$ Pa, and the annealing rate in the section of from 1,100° C. to 850° C. was changed to 1° C.·hr$^{-1}$. As a result, volume average bulk density just after synthesis was 0.36 g·cm$^{-3}$, variation in bulk density was 0.06 g·cm$^{-3}$, volume average bulk density after pre-sintering was 0.50 g·cm$^{-3}$, and volume average bulk density after the dehydration treatment in the vitrification step was 1.10 g·cm$^{-3}$.

Physical property values of the synthetic silica glass body having been subjected to all of the above steps were measured, and are shown in Table 1.

The preparation conditions and evaluation results of Examples 1 to 4 and Comparative Example 1 to 4 are summarized in Table 1.

TABLE 1

| | Unit | Ex. 1 | Ex. 2 | Ex. 3 | Ex. 4 | Comp. Ex. 1 | Comp. Ex. 2 | Comp. Ex. 3 | Comp. Ex. 4 |
|---|---|---|---|---|---|---|---|---|---|
| Rate of increase in flow rate | — | 0% | 5% | 10% | 10% | −5% | 5% | 13% | 5% |
| Volume average bulk density just after synthesis | g·cm$^{-3}$ | 0.34 | 0.36 | 0.38 | 0.38 | 0.29 | 0.36 | 0.40 | 0.36 |
| Variation in bulk density distribution just after synthesis | g·cm$^{-3}$ | 0.03 | 0.04 | 0.08 | 0.09 | 0.01 | 0.05 | 0.14 | 0.06 |
| Average bulk density after pre-sintering | g·cm$^{-3}$ | 0.47 | 0.50 | 0.53 | 0.53 | 0.40 | 0.50 | 0.55 | 0.50 |
| Dehydration temperature | ° C. | 1220 | 1220 | 1180 | 1180 | 1260 | 1180 | 1180 | 1220 |
| Dehydration time | hr | 108 | 132 | 168 | 192 | 60 | 132 | 288 | 132 |
| Degree of vacuum in dehydration treatment | Pa | $2 \times 10^{-3}$ | $2 \times 10^{-3}$ | $5 \times 10^{-3}$ | $5 \times 10^{-4}$ | $3 \times 10^{-2}$ | $5 \times 10^{-1}$ | $2 \times 10^0$ | $1 \times 10^0$ |
| Bulk density after dehydration treatment | g·cm$^{-3}$ | 0.96 | 1.10 | 0.68 | 0.70 | 1.62 | 0.62 | 0.82 | 1.10 |
| Temperature decreasing rate | ° C.·hr$^{-1}$ | 0.25 | 0.05 | 0.05 | 0.25 | 0.5 | 0.5 | 0.5 | 1 |
| Maximum OH group content | wt ppm | 9.3 | 6.5 | 3.6 | 4.4 | 12.5 | 7 | 0.5 | 5.9 |
| Variation in OH group content distribution | wt ppm | 0.8 | 1.5 | 2.1 | 2.2 | 0.7 | 1.2 | 2.3 | 1.3 |
| Fictive temperature | ° C. | 1028 | 1012 | 1017 | 1036 | 1035 | 1047 | 1070 | 1075 |
| Variation in fictive temperature distribution | ° C. | <1 | <1 | <1 | <1 | 4 | 6 | 8 | 6 |
| Hydrogen molecule | cm$^{-3}$ | $3 \times 10^{16}$ | $1 \times 10^{16}$ | $8 \times 10^{16}$ | $2 \times 10^{17}$ | $2 \times 10^{16}$ | $2 \times 10^{16}$ | $2 \times 10^{16}$ | $2 \times 10^{16}$ |
| ODC | cm$^{-3}$ | $<5 \times 10^{12}$ | $8 \times 10^{12}$ | $1 \times 10^{13}$ | $<5 \times 10^{12}$ | $8 \times 10^{12}$ | $6 \times 10^{14}$ | $8 \times 10^{14}$ | $9 \times 10^{14}$ |
| E-prime center | cm$^{-3}$ | $<5 \times 10^{12}$ | $7 \times 10^{12}$ | $3 \times 10^{13}$ | $<5 \times 10^{12}$ | $1 \times 10^{13}$ | $6 \times 10^{13}$ | $2 \times 10^{14}$ | $1 \times 10^{14}$ |
| SiH | — | $<1 \times 10^{-4}$ | $<1 \times 10^{-4}$ | $<1 \times 10^{-4}$ | $<1 \times 10^{-4}$ | $1 \times 10^{-3}$ | $5 \times 10^{-3}$ | $4 \times 10^{-4}$ | $2 \times 10^{-4}$ |
| Peroxy linkage | cm$^{-3}$ | $<1 \times 10^{16}$ | $<1 \times 10^{16}$ | $<1 \times 10^{16}$ | $<1 \times 10^{16}$ | $7 \times 10^{16}$ | $<1 \times 10^{16}$ | $<1 \times 10^{16}$ | $<1 \times 10^{16}$ |

TABLE 1-continued

| | Unit | Ex. 1 | Ex. 2 | Ex. 3 | Ex. 4 | Comp. Ex. 1 | Comp. Ex. 2 | Comp. Ex. 3 | Comp. Ex. 4 |
|---|---|---|---|---|---|---|---|---|---|
| Metal impurities | wt ppb | <0.6 | <0.6 | <0.6 | <0.6 | <0.6 | 11 | 26 | 35 |
| Fluorine | wt ppm | <10 | <10 | <10 | <10 | <10 | <10 | <10 | <10 |
| Chlorine | wt ppb | <10 | <10 | <10 | <10 | 30 | <10 | <10 | <10 |
| Initial transmission | $cm^{-1}$ | 99.83% | 99.81% | 99.76% | 99.83% | 99.81% | 98.45% | 93.05% | 96.90% |
| Transmission after irradiation | $cm^{-1}$ | 99.71% | 99.58% | 99.47% | 99.71% | 99.58% | 82.81% | 73.88% | 74.75% |
| Compaction | ppb | 253 | 177 | 98 | 120 | 348 | 790 | 814 | 1060 |
| PIB | $nm \cdot cm^{-1}$ | 0.14 | 0.11 | 0.06 | 0.07 | 0.20 | 0.71 | 0.81 | 0.99 |

Although the present invention has been described in detail and by reference to the specific embodiments, it is apparent to one skilled in the art that various modifications or changes can be made therein without departing the spirit and scope of the present invention.

This application is based on Japanese Patent Application No. 2009-250195 filed on Oct. 30, 2009, the disclosure of which is incorporated herein by reference.

The invention claimed is:

1. An optical member comprising:
a synthetic silica glass which does not substantially contain a halogen element, has a maximum OH group content of less than 10 ppm by weight, has contents of an oxygen deficient center and an E-prime center of each less than $1 \times 10^{14}$ $cm^{-3}$, does not substantially contain SiH and peroxy linkage, and has a fictive temperature of 1,050° C. or lower,
wherein the synthetic silica glass is transparent to a deep ultraviolet light having a wavelength of 250 nm or shorter.

2. The optical member according to claim 1, wherein variation in the fictive temperature in the synthetic silica glass is 5° C. or less.

3. A process for producing the optical member according to claim 1,
wherein the process comprises:
synthesizing a porous synthetic silica glass body having a volume average bulk density of 0.33 $g \cdot cm^{-3}$ or more, the synthesizing comprising growing glass fine particles by a flame hydrolysis reaction of a raw material comprising a silicon compound;
pre-sintering the porous synthetic silica glass body after the synthesizing;
subjecting the porous synthetic silica glass body to a heat treatment at a temperature in a range of from 1,050 to 1,250° C. for more than 90 hours in vacuum at a pressure of $1 \times 10^{-2}$ Pa or less; and
performing a transparent vitrification of the porous synthetic silica glass body to obtain the synthetic silica glass.

4. The process according to claim 3, wherein the porous synthetic silica glass body synthesized has a variation in the bulk density of 0.1 $g \cdot cm^{-3}$ or less.

5. A process for producing the optical member according to claim 2,
wherein the process comprises:
synthesizing a porous synthetic silica glass body having a volume average bulk density of 0.33 $g \cdot cm^{-3}$ or more, the synthesizing comprising growing glass fine particles by a flame hydrolysis reaction of a raw material comprising a silicon compound;
pre-sintering the porous synthetic silica glass body after the synthesizing;
subjecting the porous synthetic silica glass body to a heat treatment at a temperature in a range of from 1,050 to 1,250° C. for more than 90 hours in vacuum at a pressure of $1 \times 10^{-2}$ Pa or less; and
performing a transparent vitrification of the porous synthetic silica glass body to obtain the synthetic silica glass.

6. The process according to claim 5, wherein the porous synthetic silica glass body synthesized has a variation in the bulk density of 0.1 $g \cdot cm^{-3}$ or less.

7. The process according to claim 3, wherein the porous synthetic silica glass body having the volume average bulk density of the 0.37 $g \cdot cm^{-3}$ or more is synthesized before the pre-sintering.

8. The process according to claim 7, wherein the pressure in the heat treatment is $3 \times 10^{-3}$ Pa or less.

9. The process according to claim 8, wherein the pressure in the heat treatment is $1 \times 10^{-3}$ Pa or less.

10. The process according to claim 9, wherein the temperature in the heat treatment is in a range of from 1,100 to 1,200° C.

11. A process for producing an optical member, comprising:
synthesizing a porous synthetic silica glass body having a volume average bulk density of 0.33 $g \cdot cm^{-3}$ or more, the synthesizing comprising growing glass fine particles by a flame hydrolysis reaction of a raw material comprising a silicon compound;
pre-sintering the porous synthetic silica glass body after the synthesizing;
subjecting the porous synthetic silica glass body to a heat treatment at a temperature in a range of from 1,050 to 1,250° C. for more than 90 hours in vacuum at a pressure of $1 \times 10^{-2}$ Pa or less; and
performing a transparent vitrification of the porous synthetic silica glass body to obtain a synthetic silica glass.

12. The process according to claim 11, wherein the porous synthetic silica glass body having the volume average bulk density of the 0.37 $g \cdot cm^{-3}$ or more is synthesized before the pre-sintering.

13. The process according to claim 12, wherein the pressure in the heat treatment is $1 \times 10^{-3}$ Pa or less.

14. The process according to claim 13, wherein the temperature in the heat treatment is in a range of from 1,100 to 1,200° C.

15. An optical member produced by the process according to claim 11, wherein the synthetic silica glass does not substantially contain a halogen element, has a maximum OH group content of less than 10 ppm by weight, has contents of an oxygen deficient center and an E-prime center of each less than $1 \times 10^{13}$ $cm^{-3}$, does not substantially contain SiH and peroxy linkage, and has a fictive temperature of 1,050° C. or lower.

16. The optical member according to claim 15, wherein variation in the fictive temperature in the synthetic silica glass is 1° C. or less.

17. The optical member according to claim 1, wherein the synthetic silica glass has the maximum OH group content of 5 ppm by mass or less and 1 ppm by mass or more.

18. The optical member according to claim 17, wherein the fictive temperature is 1,020° C. or lower.

19. The optical member according to claim 17, wherein variation in the fictive temperature in the synthetic silica glass is 1° C. or less.

20. The optical member according to claim 17, wherein the contents of the oxygen deficient center and the E-prime center in the synthetic silica glass are each less than $1 \times 10^{13}$ $cm^{-3}$.

* * * * *